United States Patent
Song

(10) Patent No.: US 9,106,458 B2
(45) Date of Patent: Aug. 11, 2015

(54) METHOD FOR DETECTING PHASE AND PHASE DETECTING SYSTEM

(71) Applicant: SK hynix Inc., Icheon-si Gyeonggi-do (KR)

(72) Inventor: Keun Soo Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/224,319

(22) Filed: Mar. 25, 2014

(65) Prior Publication Data

US 2015/0139364 A1    May 21, 2015

(30) Foreign Application Priority Data

Nov. 19, 2013  (KR) .................. 10-2013-0140378

(51) Int. Cl.
*H03D 3/24* (2006.01)
*H04L 25/02* (2006.01)
*H04L 7/033* (2006.01)

(52) U.S. Cl.
CPC ............ *H04L 25/0262* (2013.01); *H04L 7/033* (2013.01)

(58) Field of Classification Search
CPC ..... H04L 25/0262; H04L 7/033; H03L 7/087; H03L 7/091; H03L 7/0891; H03L 7/0814
USPC ......... 375/375, 356, 357, 358, 371, 372, 373; 365/191, 193, 194
See application file for complete search history.

(56) References Cited

U.S. PATENT DOCUMENTS

| | | | |
|---|---|---|---|
| 8,824,223 B2 * | 9/2014 | Lee ................................ | 365/193 |
| 2007/0025175 A1 * | 2/2007 | Liu et al. ........................ | 365/233 |
| 2011/0243289 A1 * | 10/2011 | Seol et al. ..................... | 375/371 |
| 2012/0250434 A1 * | 10/2012 | Song .............................. | 365/193 |
| 2013/0308401 A1 * | 11/2013 | Yang ............................. | 365/191 |

\* cited by examiner

*Primary Examiner* — Phuong Phu

(74) *Attorney, Agent, or Firm* — William Park & Associates Ltd.

(57) ABSTRACT

A phase detection method includes providing by a controller a second control signal having two or more neighboring pulses when the time during which a state of a second control signal is retained is a predetermined time or more, receiving by the controller phase detection results of a phase of a first control signal different from the second control signal in response to the second control signal, and determining by the controller a phase detection result based on a first pulse of the two neighboring pulses of the second control signal, of the phase detection results.

20 Claims, 16 Drawing Sheets

METHOD FOR DETECTING PHASE AND PHASE DETECTING SYSTEM

CROSS-REFERENCES TO RELATED APPLICATION

The present application claims priority under 35 U.S.C. §119(a) to Korean application number 10-2013-0140378, filed on Nov. 19, 2013, in the Korean Intellectual Property Office, which is incorporated herein by reference in its entirety.

TECHNICAL FIELD

Various embodiments relate to a method and system for detecting a phase, and more particularly, to a method and system for detecting a phase to determine a phase detection result is guaranteed when a specific condition is satisfied.

BACKGROUND

An electronic device is equipped with a plurality of operation units for performing various types of operations.

As operation speed of an electronic device becomes fast, operation signals that are supplied to a plurality of operation units in common may not be supplied to the plurality of operation units at the same timing. That is because of positions where the operation units are disposed or the characteristics of signal coupling lines coupled to the operation units.

SUMMARY

In an embodiment, a phase detection method includes providing by a controller a second control signal having two or more neighboring pulses in case of a second control signal is maintained to a state during a predetermined time or more. Further, the phase detection method also includes receiving by the controller phase detection results of a phase of a first control signal different from the second control signal in response to the second control signal. The phase detection method may also include determining by the controller a phase detection result based on a first pulse of the two neighboring pulses of the second control signal, of the phase detection results.

In an embodiment, a phase detection system includes a controller configured to generate a second control signal having two or more neighboring pulses when a first state of a second control signal retained is a predetermined time or more. The controller may also be configured to generate the second control signal having one or more pulses during which the first state of the second control signal is retained when the first state of the second control signal retained is less than the predetermined time. In addition, an operation unit may be configured to comprise a phase detection unit for generating phase detection results of a phase of a first control signal different from the second control signal in response to the second control signal.

In an embodiment the phase detection system includes a controller configured to generate a second control signal having two or more neighboring pulses when a first state of a second control signal retained is a predetermined time or more. The controller may also generate a second control signal having one or more pulses of which the first state of the second control signal is retained during which the first state of the second control signal retained is less than the predetermined time. An operation unit may be configured to comprise a phase detection unit for receiving the second control signal; removing a first pulse of the two or more neighboring pulses when the first state of the second control signal retained is the predetermined time or more; removing a first pulse of the one or more pulses when the first state of the second control signal retained is less than the predetermined time; and generating phase detection results by detecting a phase of a first control signal different from the second control signal in response to the filtered second control signal.

For example, the controller may generate the second control signal having two or more neighboring pulses to the memory device when an accurate phase detection result is not accurate.

The controller may determine whether the phase detection result in response to the first pulse of the second control signal is uncertain and whether the phase detection results in response to all pulses after the second pulse of the second control signal are accurate.

In an embodiment, a computing system comprises: a processor electrically coupled to a memory device. In addition the computing system also includes a controller configured to generate a second control signal having two or more neighboring pulses when a first state of a second control signal retained is a predetermined time or more. The controller may also be configured to generate the second control signal having one or more pulses during which the first state of the second control signal is retained when the first state of the second control signal retained is less than the predetermined time. In addition, an operation unit may be configured to comprise a phase detection unit for generating phase detection results of a phase of a first control signal different from the second control signal in response to the second control signal.

DETAILED DESCRIPTION

Figure 1:
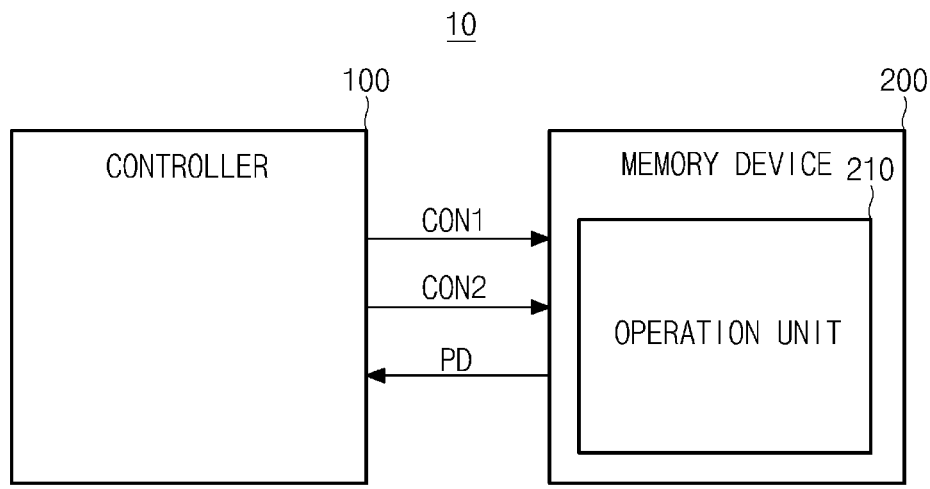
FIG. 1 is a block diagram showing a phase detection system according to an embodiment.

Hereinafter, a method and system for detecting a phase will be described below with reference to the accompanying drawings through various embodiments.

Some embodiments are described in more detail with reference to the accompanying drawings. The same reference numerals are used to denote the same elements throughout the drawings, and a redundant description of the same elements is omitted.

Specific structural and functional descriptions of embodiments described in this specification have been merely illustrated to describe the embodiments. The embodiments may be implemented in various forms and should not be construed as being limited to embodiments described in this specification or application.

FIG. 1 is a block diagram showing a phase detection system according to an embodiment.

Referring to FIG. 1, the phase detection system 10 according to an embodiment may include a controller 100 and a memory device 200.

The controller 100 generates various types of signals for controlling the memory device 200 and transmits the signals. The controller 100 may provide various types of control signals (i.e. a command/address signal CA and operation mode signals MPW and MRW) to the memory device 200. The phase detection system 10 may enter a specific operation mode based on a signal provided by an external device, such as a host (not shown) (refer to FIG. 15). The controller 100 may generate different control signals depending on an operation mode and provide the different control signals to different elements.

For example, the detection of a phase is performed based on a first control signal CON1 and a second control signal CON2 provided by the controller 100. More particularly, a phase of the first control signal CON1 is detected at a corresponding point of time in response to a pulse (to be concrete, a rising edge) of the second control signal CON2.

A signal characteristic of the second control signal CON2 may be contained in a signal that is received by the controller 100 from the outside. The signal characteristic may include information about an area in which the second control signal CON2 maintains a logic state "Low." More particularly, the second control signal CON2 may be a signal that alternately has two logic states, such as a logic state "High" and a logic state "Low."

The controller 100 may be provided with the time during which the second control signal CON2 maintains a logic state "Low" as a low state retention time, and the controller 100 may generate the second control signal CON2 based on the low state retention time. In various embodiments, the controller 100 may be provided with the time when the second control signal CON2 maintains a logic state "High" as a high state retention time. The first state may be the logic state "Low" and a second state may the logic state "High." The second state of the second control signal CON2 may also correspond to a time during which a pulse of the second control signal CON2 is maintained.

After the phase detection system 10 enters a phase detection mode, a serious distortion is generated in the first pulse of the second control signal CON2 supplied to the memory device 200 because the time when the second control signal CON2 retained a logic state "Low" is relatively very long. As a result, it is difficult to guarantee accuracy for a phase detection result based on the second control signal CON2 in which distortion was generated.

For this reason, after entering the phase detection mode, the controller 100 differently provides the second control signal CON2 to the memory device 200 based on a low state retention time.

For example, when a low state retention time of the second control signal CON2 is the same as or greater than a predetermined time, the controller 100 generates the second control signal CON2 having two or more neighboring pulses and provides the generated second control signal CON2 to the memory device 200. This is for taking a phase detection result PD obtained in response to a second pulse that neighbors the first pulse of the second control signal CON2 after the first pulse because a phase detection result PD obtained in response to the first pulse of the second control signal CON2 is uncertain.

Assuming the case where a low state retention time of the second control signal CON2 is the same as or greater than a predetermined time when the second control signal CON2 is generated based on only the low state retention time, all phase detection results may be uncertain because one pulse is supplied to the memory device 200 at a very long period of the low state retention time. Accordingly, in order to solve such a problem, when a low state retention time of the second control signal CON2 is a predetermined time or more, the controller 100 may generate a second control signal CON2 having two or more neighboring pulses within a specific time and provide the generated second control signal CON2 to the memory device 200. Thereafter, after a lapse of the low state retention time, the controller 100 may generate a second control signal CON2 having two neighboring pulses again and may provide the generated second control signal CON2 to the memory device 200.

In various embodiments, a period between neighboring pulses of the second control signal CON2 may be related to the period of the first control signal CON1. For example, the controller 100 may generate the second control signal CON2 so that a period between pulses of the second control signal CON2, particularly, a period between the rising edges of the pulses is the same as the period of the first control signal CON1 and provide the second control signal CON2 to the memory device 200.

In an embodiment, when a low state retention time of the second control signal CON2 is less than a predetermined time, although the controller 100 generates the second control signal CON2 based on only the low state retention time and provides the second control signal CON2 to the memory device 200, phase detection results obtained in response to subsequent pulses other than the first pulse of the second control signal CON2 may be determined to be relatively accurate. Accordingly, when a low state retention time of the second control signal CON2 is less than a predetermined time, the controller 100 according to an embodiment generates the second control signal CON2 including one or more pulses having a period of the low state retention time and provide the second control signal CON2 to the memory device 200.

When a low state retention time of the second control signal CON2 is less than a predetermined time, the controller 100 may determine that only a phase detection result PD obtained in response to the first pulse of the second control signal CON2 after entering the phase detection mode is uncertain and that phase detection results PD obtained in response to the remaining pulses are accurate.

The memory device 200 includes at least one operation unit 210 and detects a phase of the first control signal CON1 that is different from the second control signal CON2 in response to a pulse of the second control signal CON2. When the memory device 200 includes a plurality of the operation units 210, the operation units 210 may perform the same operation or different operations as respective independent units. The memory device 200 provides a phase of the first control signal CON1 at a specific point of time of the second control signal CON2 to the controller 100 as the phase detection result PD.

The controller 100 may determine a specific phase detection result PD, belonging to phase detection results PD received from the memory device 200, to be uncertain based on a low state retention time of the second control signal CON2. A determination of accuracy for a phase detection result PD based on a low state retention time of the second control signal CON2 is described in detail with reference to FIGS. 3 to 6. The phase detection result PD may be determined based on the first pulse of the neighboring pulses of the second control signal CON2.

In various embodiments, when a phase detection result PD determined to be accurate has passed one period, the controller 100 may terminate the phase detection mode. In a normal operation after the phase detection mode is terminated, the controller 100 may control a point of time at which the second control signal CON2 is generated based on a phase detection result PD that is determined to be accurate. The controller 100 may control generation times of the pulses of the second control signal CON2 based a determination of an accuracy of the phase detection result PD.

In various embodiments, the operation unit 210 of the memory device 200 may be implemented using a memory module (now shown) for storing data. The memory module may independently operate in response to a control signal received from the controller 100. The memory module may include volatile or non-volatile memory cells in order to write/read data.

For example, the operation unit 210 may receive control signals, provided by the controller 100, through a plurality of signal coupling lines of the memory device 200 or transmit a signal to the controller 100 through the signal coupling lines.

For example, where the memory device 200 includes a plurality of the operation units 210, the controller 100 may provide control signals to the plurality of operation units 210 because the operation units 210 operate independently. The control signals may include a clock signal, a command/address signal, and a data strobe signal.

In various embodiments, the control signals may be supplied to the operation units 210 in common or individually. For example, the controller 100 and the memory device 200 may implemented as an additional chip and send and receive signals through a signal coupling line, such as a pin. The meaning that the control signal is provided in common means that the control signal is supplied to the memory device 200 through one signal coupling line and the control signal is supplied to each operation unit through an additional signal path within the memory device 200. This is called a fly-by design, for example.

In an embodiment, the meaning that the control signals are provided individually means that the control signal is provided from the controller 100 to each operation unit 210 through each signal coupling line.

The providing of the control signals is described in detail with reference to FIG. 2.

Figure 2:
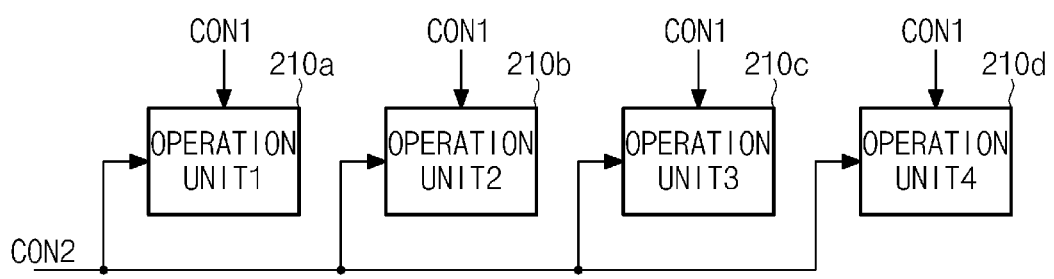
FIG. 2 is a conceptual diagram illustrating the paths of control signals that are provided from a controller to operation units.

FIG. 2 is a conceptual diagram illustrating the paths of control signals that are provided from the controller to operation units.

Referring to FIG. 2, two types of control signals are supplied to a plurality of operation units 210a, 210b, 210c, and 210d.

In various embodiments, the two types of control signals may include a first control signal CON1 that is sequentially supplied to the operation units 210a, 210b, 210c, and 210d through one path and second control signals CON2 individually supplied to the respective operation units 210a, 210b, 210c, and 210d.

In various embodiments, the second control signals CON2 may be individually supplied from the controller 100 to the respective operation units 210a, 210b, 210c, and 210d through terminals or signal couplers, such as pins. The first control signal CON1 is received by the memory device 200 through one signal coupling line, such as a terminal or pin. After the first control signal CON1 is received, the first control signal CON1 may be split into various signal paths within the memory device 200, and thus the first control signal CON1 may reach the operation units 210a, 210b, 210c, and 210d.

Ideally, the time that is taken for the first control signal CON1 to reach the respective operation units 210a, 210b, 210c, and 210d is the same as the time that is taken for the second control signals CON2 to reach the respective operation units 210a, 210b, 210c, and 210d. Accordingly, there is no difference between the phases of the first control signal CON1 and the second control signals CON2 within the operation units 210a, 210b, 210c, and 210d, or the first control signal CON1 and the second control signals CON2 within the operation units 210a, 210b, 210c, and 210d may have the same phase difference although there is a difference in the phase.

However, the amount of delay of the first control signal CON1 supplied to the fourth operation unit 210d is expected to be greater than that of the first control signal CON1 supplied to the first operation unit 210a because paths along which the first control signal CON1 is supplied are different. In contrast, points of time at which the second control signals CON2 are received by the respective operation units 210a, 210b, 210c, and 210d will be substantially the same.

It is necessary to synchronize the phases of the first control signal CON1 and the second control signal CON2 because reliability of the operation units 210a, 210b, 210c, and 210d can be improved only when the first control signal CON1 and the second control signal CON2 operate with the same phase.

It is however necessary to perform a phase detection operation on each of the operation units 210a, 210b, 210c, and 210d because a difference between the phases of the first control signal CON1 and the second control signal CON2 in the operation units 210a, 210b, 210c, and 210d will be different as described above.

A difference between the phases of the first control signal CON1 and the second control signal CON2 may be generated due to various factors in addition to the aforementioned signal path. For example, due to signal integrity or the characteristics of reception buffers by which the first control signal CON1 and the second control signal CON2 are received within the operation units 210a, 210b, 210c, and 210d, a phase difference may be generated or a point of time at which a phase is detected may be different.

Factors that determine signal integrity may include noise, a point of time at which a signal is transferred, and electromagnetic interface (EMI). A signal integrity characteristic may be different depending on a shape of the path of a signal line provided in response to the second control signal CON2 or peripheral circuits. Furthermore, an ability to detect the second control signal CON2 of a specific level may be different depending on a characteristic of the reception buffer.

In various embodiments, the first control signal CON1 may correspond to a clock signal CLK, and the second control signal CON2 may correspond to a data strobe signal DQS. The data strobe signal DQS may be a signal from which a pulse is generated at a specific point of time, and the clock signal CLK may be a signal that oscillates in a constant period. In various embodiments, the first control signal CON1 and the second control signal CON2 may be different, but the present disclosure is not limited thereto.

Figure 3:
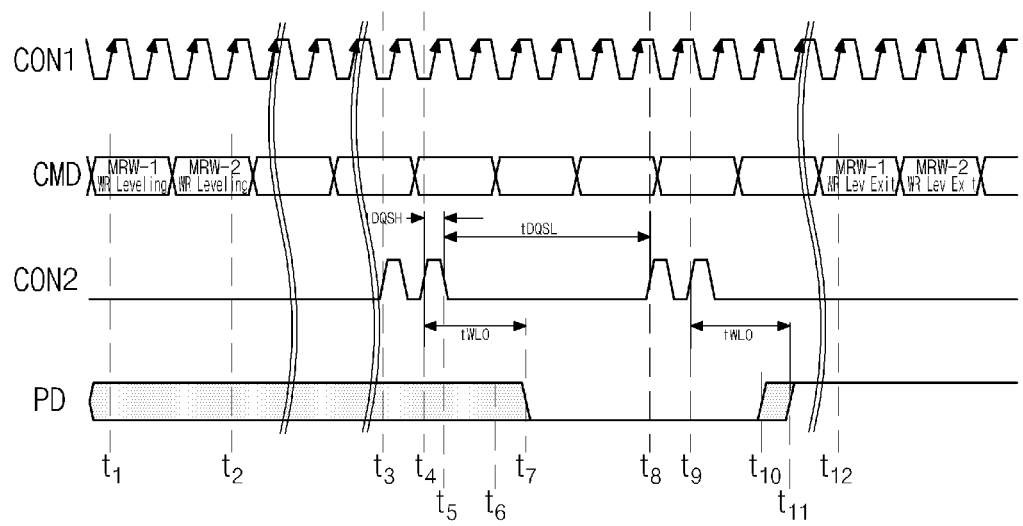
FIGS. 3 and 4 are timing diagrams illustrating a phase detection method according to an embodiment.
Figure 4:
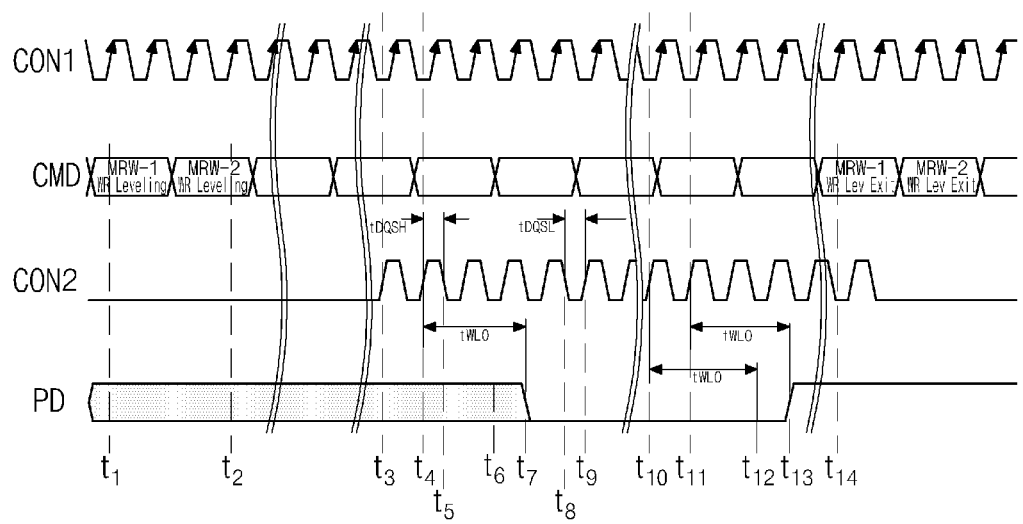

FIGS. 3 and 4 are timing diagrams illustrating a phase detection method according to an embodiment. FIGS. 3 and 4 illustrate cases where different operations are performed based on the time during which a low state of a second control signal CON2 is retained (hereinafter referred to as a 'low state retention time of a second control signal CON2'). For example, when the second control signal CON2 corresponds to a data strobe signal DQS, the time during which a low state of the second control signal CON2 is retained (hereinafter referred to as the 'low state retention time of the second control signal CON2') may be indicated by "tDQSL," and the time during which a high state of the second control signal CON2 is retained (hereinafter referred to as the 'high state retention time of the second control signal CON2') may be indicated by "tDQSH."

FIG. 3 shows a case where the low state retention time tDQSL of the second control signal CON2 is set to a maximum value, and FIG. 4 shows a case where the low state retention time tDQSL of the second control signal CON2 is set to a minimum value. The setting of the low state retention time tDQSL may be performed by an external device, such as a host.

In various embodiments, the controller 100 may generate a second control signal CON2 based on the low state retention time tDQSL, determine that information about a specific area of a phase detection result PD received from the memory device 200 is accurate, determine information about the remaining areas of the phase detection result PD to be uncertain, and neglect the information about the remaining areas (i.e., invalid).

Referring to FIG. 3, a first control signal CON1 may be a signal that oscillates in a constant period. In various embodiments, the first control signal CON1, together with its complementary signal, may be differentially provided. Accuracy in the detection of a phase of the first control signal CON1 can be improved by performing a differential operation. For example, the memory device 200 may perform phase detection on each of the differential signals of the first control signal CON1 and each of the differential signals of the second control signal CON2.

At a first time t1, the controller 100 generates a command signal CMD. The command signal CMD is supplied to the memory device 200 up to a second time t2. At the second time t2, the phase detection system 10 enters a phase detection mode. The command signal CMD may include information about the time during which the first state of the second control signal CON2 is retained.

In various embodiments, the phase detection mode may include write leveling. Write leveling is an operation of synchronizing the phases of a clock signal CLK and a data strobe signal DQS by controlling a point of time at which the data strobe signal DQS is generated after detecting the phases of the clock signal CLK and the data strobe signal DQS. For example, write leveling may be performed prior to a training operation.

FIG. 3 shows a case where the low state retention time is set to a maximum value. The controller 100 can check the low state retention time by decoding an external signal and determine a method of generating the second control signal CON2. In FIG. 3, the low state retention time of the second control signal CON2 is from a fifth time t5 to an eighth time t8.

After entering the phase detection mode, the controller 100 determines that the low state retention time of the second control signal CON2 is the same as or greater than a predetermined time, generates a second control signal CON2 having two or more neighboring pulses, and provides the generated second control signal CON2 to the memory device 200.

Referring to FIG. 3, at third and fourth time t3 and t4, a second control signal CON2 having neighboring pulses is supplied to the memory device 200. In various embodiments, a period between the first rising edge and the second rising edge (i.e., a period between the third time t3 and the fourth time t4 in FIG. 3) of the second control signal CON2 may be the same as the period of the first control signal CON1 or may be within the period of the first control signal CON1.

As described above, the memory device 200 performs phase detection in response to the first pulse of the second control signal CON2 provided at the third time t3, but it is difficult to guarantee accuracy of a phase detection result PD of the first pulse. Accordingly, the phase detection result PD obtained in response to the first pulse of the second control signal CON2 at the third time t3 may be provided at a sixth time t6, but the controller 100 determines a phase detection result PD at the sixth time t6 to be uncertain. FIGS. 3 and 4 illustrate a write WR leveling with operation mode signals MRW-1 and MRW-2 and a write WR leveling Exit with operation mode signals MRW-1 and MRW-2.

Thereafter, the controller 100 detects a phase of the first control signal CON1 in response to the second pulse of the second control signal CON2 at the fourth time t4 and determines a phase detection result PD output at a seventh time t7 to be accurate. At the fourth time t4, the memory device 200 provides the controller 100 with a phase detection result PD, obtained in response to a logic state "High" at the seventh time t7, based on the detected phase of the first control signal CON1.

After the fifth time t5, at the eighth time t8 after a lapse of the low state retention time, a second control signal CON2 is supplied to the memory device 200 again. Likewise, since the low state retention time of the second control signal CON2 is a predetermined time or more, the controller 100 generates a second control signal CON2 having two pulses that neighbor each other at eighth and ninth time t8 and t9 and provides the generated second control signal CON2 to the memory device 200.

Likewise, the memory device 200 detects a phase of the first control signal CON1 at the eighth time t8 and a phase of the first control signal CON1 at the ninth time t9 in response to the second control signal CON2, generates phase detection results PD, and provides the phase detection results PD to the controller 100 at tenth and eleventh time t10 and t11.

The controller 100 determines the phase detection result PD provided at the tenth time t10 to be uncertain and determines the phase detection result PD provided at the eleventh time t11 to be accurate.

Accuracy of the phase detection results PD may be determined by calculating timing within the controller 100. For example, the controller 100 may receive a phase detection result PD after a lapse of some latency (tWLO in FIG. 3) from the eighth time t8 at which the first pulse was provided by the controller 100. Accordingly, the controller 100 determines that a phase detection result PD is accurate after a lapse of some latency since a pulse determined to be accurate. In FIG. 3, 't8+tWLO=t10' may be determined to be an uncertain phase detection result PD, and 't9+tWLO=t11' may be determined to be an accurate phase detection result PD.

The phase detection results PD at the points of time t7 and t11 that are determined to be accurate phase detection results are considered to have opposite logic states. In such a case, the controller 100 considers that the phase detection results PD have been centered and terminates the phase detection mode at a twelfth time t12.

When the phase detection mode is not terminated, a second control signal CON2 having two pulses that neighbor each other at points of time after a lapse of the low state retention time since the pulses of the second control signal CON2 at the ninth time t9 are provided may be supplied to the memory device 200.

A phase detection method according to an embodiment can improve a problem in that it is difficult to accurately detect a phase of a second control signal CON2 that is provided first due to signal integrity and the characteristics of a device, such as a reception buffer within the memory device 200.

FIG. 4 shows a timing diagram illustrating a case where the low state retention time of the second control signal CON2 is less than the predetermined time.

Referring to FIG. 4, a process of applying a command signal CMD at a first time t1 and entering a phase detection mode at a second time t2 is the same as that of FIG. 3. In FIG. 4, the controller 100 may generate a second control signal CON2 using a method different from the method of FIG. 3 based on the low state retention time.

The low state retention time tDQSL in FIG. 4 is from an eighth time t8 to a ninth time t9. When the low state retention time tDQSL is less than the predetermined time, accuracy of phase detection results PD obtained in response to pulses of the second control signal CON2 right after a lapse of the low state retention time can be secured. Accordingly, when the low state retention time is less than the predetermined time, the second control signal CON2 has only to be generated based on the low state retention time.

After entering the phase detection mode, the controller 100 may provide the first pulse of a second control signal CON2 at a third time t3 after a lapse of the predetermined time, provide the second pulse of the second control signal CON2 at a fourth time t4 after a lapse of the low state retention time tDQSL since the first pulse is supplied, generate a second control signal CON2 having pulses at a point of time after a lapse of the low state retention time tDQSL since the second pulse is supplied, and provide the generated second control signal CON2 to the memory device 200.

A high state retention time tDQSH may also be set in the second control signal CON2. In FIG. 4, the high state retention time has been illustrated as being from a fourth time t4 to a fifth time t5, and it may also be represented as a pulse retention time.

A pulse that is first provided at the third time t3 after entering the phase detection mode is the first pulse after a previous state is retained for some time. Accordingly, accuracy of the pulse may not be guaranteed.

Accordingly, the controller 100 determines that a phase detection result PD obtained at a sixth time t6 after a lapse of some latency from the third time t3 is uncertain.

Furthermore, the controller 100 determines that a phase detection result PD of a phase of the first control signal CON1 at a seventh time t7 in response to the second pulse at the fourth time t4 is accurate. The controller 100 generates a second control signal CON2 including pulses having a period of the low state retention time (to be precise, a period between the rising edges of the pulses may correspond to the sum of the low state retention time and the high state retention time) until logic states of phase detection results after the phase detection result PD at the seventh time t7 determined to be accurate are reversed and provides the generated second control signal CON2 to the memory device 200.

A phase detection result PD at a twelfth time t12, obtained in response to a pulse of the second control signal CON2 at an eleventh time t10, is determined to be accurate, but the phase detection result PD has the same logic state as the phase detection result PD at the seventh time t7. Accordingly, at the eleventh time t11, a second control signal CON2 having other pulses is supplied to the memory device 200.

The memory device 200 detects a phase of the first control signal CON1 at the eleventh time t11 and provides the controller 100 with a result of the phase detection as a phase detection result PD at a thirteenth time t13. The phase detection result PD at the thirteenth time t13 is also determined to be accurate and determined to have a logic state opposite a logic state of the phase detection result PD at the seventh time t7. As a result, it is determined that the phase detection result PD at the thirteenth time t13 has been centered.

Accordingly, after terminating the phase detection mode at a fourteenth time t14, the controller 100 can control a point of time at which a second control signal CON2 is generated based on the phase detection results PD during the phase detection mode.

If the low state retention time of the second control signal CON2 is less than a predetermined time as in FIG. 4, all the phase detection results obtained in response to the pulses of the second control signal CON2 after the first pulse may be determined to be accurate.

This is because when a next pulse with less than the predetermined time is provided after the first pulse of the second control signal CON2, there is no possibility that a phase of the second control signal CON2 may be distorted due to signal integrity or a characteristic of a reception buffer.

Figure 5:
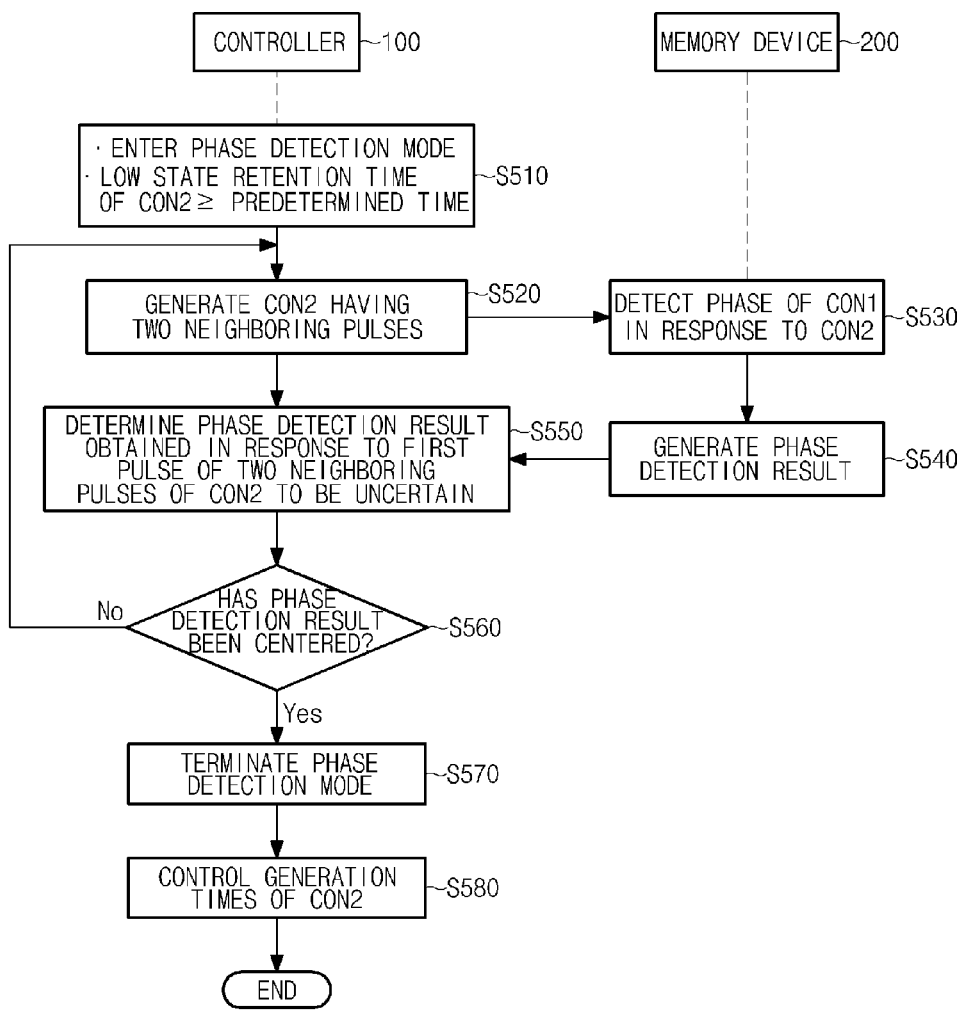
FIGS. 5 and 6 are flowcharts illustrating phase detection methods according to embodiments.
Figure 6:
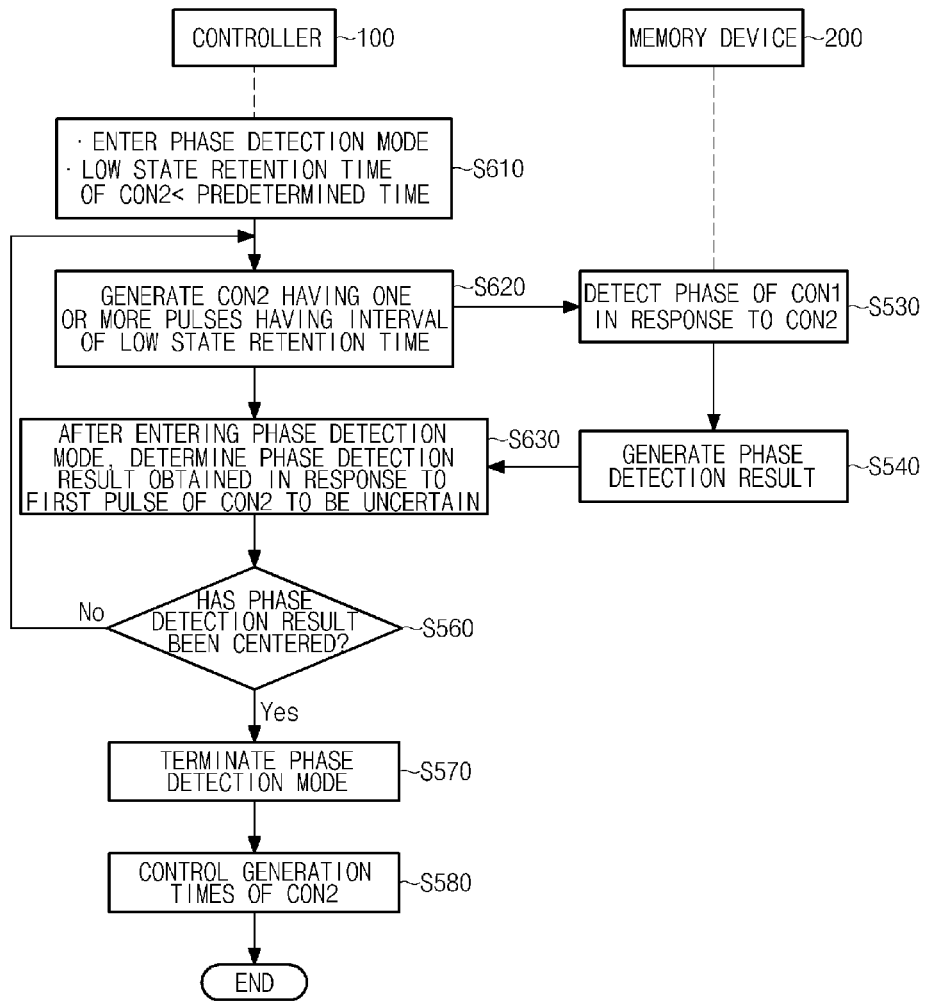

FIGS. 5 and 6 are flowcharts illustrating phase detection methods according to embodiments. FIG. 5 is a diagram illustrating a phase detection method when a low state retention time of the second control signal CON2 is the same as or greater than a predetermined time as described above with reference to FIG. 3, and FIG. 6 is a diagram illustrating a phase detection method when a low state retention time of the second control signal CON2 is less than a predetermined time as described above with reference to FIG. 4.

Referring to FIG. 5, the controller 100 generates a command signal CMD in response to an external set signal so that the memory device 200 enters a phase detection mode and checks that a low state retention time of a second control signal CON2 is a predetermined time or more at step S510.

The controller 100 generates a second control signal CON2 having two or more neighboring pulses and provides the generated second control signal CON2 to the memory device 200 at step S520.

The memory device 200 receives a first control signal CON1 and the second control signal CON2 from the controller 100 and detects phases of the first control signal CON1 in response to the two or more neighboring pulses of the second control signal CON2 at step S530. The detected phases are supplied to the controller 100 as phase detection results PD at step S540.

The controller 100 receives the phase detection results PD from the memory device 200 and determines that the phase detection result PD obtained in response to the first pulse that belongs to the two or more neighboring pulses is uncertain. The controller 100 may determine that the phase detection result PD obtained in response to the second pulse of the two or more neighboring pulses of the second control signal CON2 that have been generated at step S520 and supplied to the memory device 200 is accurate at step S550.

When the phase detection result PD determined to be accurate has not been centered, that is, when a phase detection result PD having a different logic state from a phase detection result PD first determined to be accurate is not received (No, S560), steps S520 to S550 are repeated.

When the phase detection result PD determined to be accurate has been centered (Yes, S560), however, the phase detection mode is terminated at step S570.

The controller 100 can control a point of time at which the second control signal CON2 is generated based on the phase detection results PD at step S580.

Referring to FIG. 6, the controller 100 generates a command signal CMD so that the memory device 200 enters a phase detection mode in response to an external set signal and checks that a low state retention time of a second control signal CON2 is less than a predetermined time at step S610.

The controller 100 generates a second control signal CON2 including one or more pulses having a period of a low state retention time and provides the generated second control signal CON2 to the memory device 200 at step S620.

The memory device 200 receives a first control signal CON1 and the second control signal CON2 from the controller 100 and detects one or more phases of the first control signal CON1 in response to the one or more pulses of the second control signal CON2 at step S530. The one more detected phases are supplied to the controller 100 as phase detection results PD at step S540.

The controller 100 determines that the phase detection result PD obtained in response to the first pulse of the second control signal CON2 after entering the phase detection mode is uncertain and phase detection results PD obtained in response to all pulses after the second pulse of the second control signal CON2 are accurate at step S630.

When the phase detection result PD determined to be accurate has not been centered, that is, when a phase detection result PD having a different logic state from a phase detection result PD first determined to be accurate has not been received (No, S560), steps S620, S530, S540, and S630 are repeated.

If the phase detection result PD determined to be accurate has been centered (Yes, S560), the phase detection mode is terminated at step S570.

The controller 100 can control a point of time at which the second control signal CON2 is generated based on the phase detection results PD at step S580.

Figure 7:
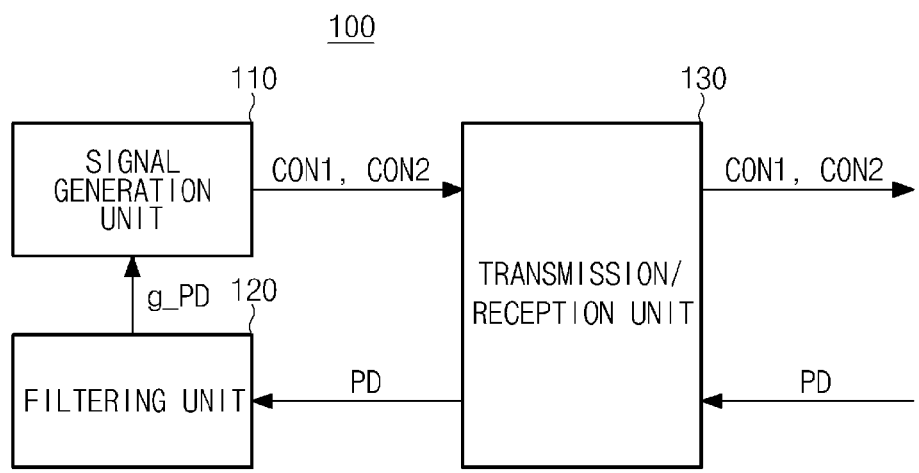
FIG. 7 is a block diagram showing an embodiment of the controller of FIG. 1.

FIG. 7 is a block diagram showing an embodiment of the controller 100 of FIG. 1 which can perform the phase detection methods described with reference to FIGS. 2 to 6.

Referring to FIG. 7, the controller 100 may include a signal generation unit 110, a filtering unit 120, and a transmission/reception unit 130.

The signal generation unit 100 can generate various types of control signals including first and second control signals CON1 and CON2. The signal generation unit 110 checks a low state retention time of a second control signal CON2 in response to an external input signal, generates a second control signal CON2 having two or more neighboring pulses if, as a result of the check, the low state retention time is a predetermined time or more, and generates a second control signal CON2 having one or more pulses with the low state retention time interposed there between if, as a result of the check, the low state retention time is less than the predetermined time.

The control signals CON1 and CON2 generated from the signal generation unit 110 can be supplied to the transmission/reception unit 130 and transmitted to the memory device 200. The transmission/reception unit 130 can receive phase detection results PD from the memory device 200 and provide the received phase detection results PD to the filtering unit 120.

The filtering unit 120 may filter only phase detection results determined to be accurate from the received phase detection results PD based on the low state retention time of the second control signal CON2 and provide the filtered phase detection results to the signal generation unit 110 as guaranteed phase detection results g_PD. The phase detection results may be based on information about the time during which the first state of the second control signal CON2 is maintained.

The filtering of the guaranteed phase detection result g_PD by the filtering unit 120 may be performed by removing a phase detection result PD that is determined to be uncertain. Accuracy of a phase detection result PD may be determined by a method of determining whether phase detection results PD obtained in response to pulses of the second control signal CON2 provided at a specific point of time are certain or uncertain based on the low state retention time of the second control signal CON2 as described above.

The signal generation unit 110 may determine that the second control signal CON2 has been centered based on the guaranteed phase detection result g_PD and may terminate a phase detection mode without generating a second control signal CON2 or control a point of time at which a second control signal CON2 is generated.

Figure 8:
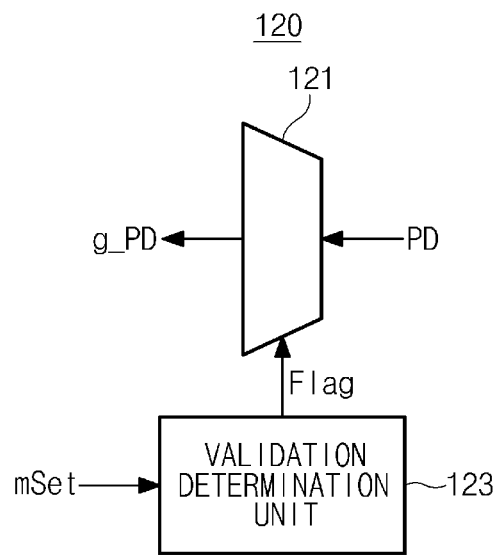
FIG. 8 is a diagram showing an embodiment of a filtering unit of FIG. 7.

FIG. 8 is a diagram showing an embodiment of the filtering unit 120 of FIG. 7.

Referring to FIG. 8, the filtering unit 120 may include a selector 121 and a validation determination unit 123.

The validation determination unit 123 may generate a flag signal Flag in response to an operation mode signal mSet that is generated based on a low state retention time of a second control signal CON2 and provide the flag signal to the selector 121. The flag signal Flag may be activated or deactivated whether a phase detection signal PD according to a specific pulse of the second control signal CON2 is determined to be accurate or not.

For example, when the low state retention time of the second control signal CON2 is a predetermined time or more, after the second pulse of the second control signal CON2 having two neighboring pulses is supplied to the memory device 200, the validation determination unit 123 may activate the flag signal Flag after a lapse of some latency (e.g., tWLO in FIGS. 3 and 4) since the second pulse is provided.

For another example, when the low state retention time of the second control signal CON2 is less than a predetermined time, after the second pulse of the second control signal CON2 after a phase detection mode is provided, the validation determination unit 123 may continue to activate the flag signal Flag after a lapse of some latency since the second pulse is provided.

In providing the phase detection signal PD as the guaranteed phase detection signal g_PD, the selector 121 may provide the signal generation unit 110 with the phase detection signal PD as the valid phase detection signal g_PD only when the flag signal Flag is activated.

In FIGS. 1 to 8, the method and system for detecting a phase have been described in which the controller 100 generates the second control signal CON2 using a different method based on a low state retention time of the second control signal CON2 and determines accuracy of phase detection results PD received accordingly. Accordingly, in the embodiments of FIGS. 1 to 8, the memory device 200 has only to output phase detection results PD in response to the first and the second control signals CON1 and CON2 provided by the controller 100, but an operation method is not changed according to the low state retention time of the second control signal CON2.

In an embodiment, the controller 100 may generate the second control signal CON2 using a different method based on a low state retention time of the second control signal CON2, but may not determine accuracy of a phase detection result PD. Instead, the memory device 200 may receive information about a low state retention time of the second control signal CON2 from the controller 100 and detect a phase by excluding pulses of the second control signal CON2 that are not accurate.

Figure 9:
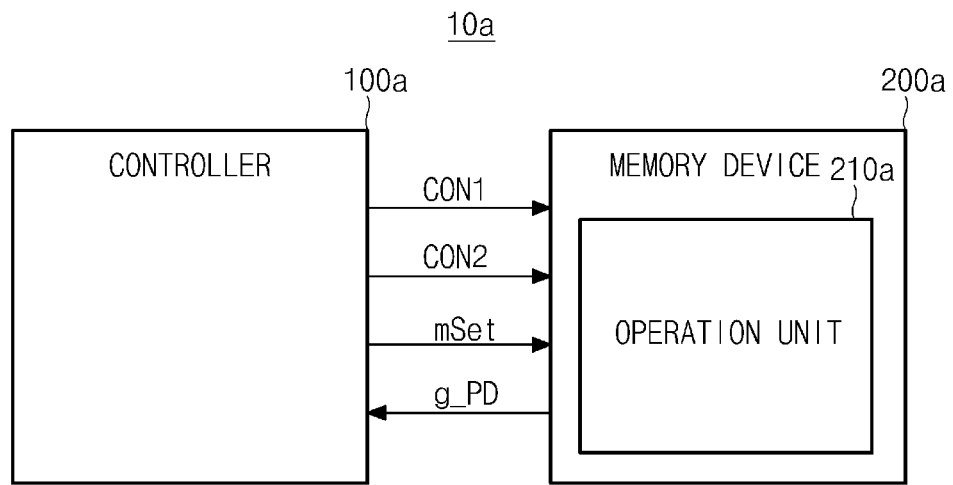
FIG. 9 is a block diagram showing a phase detection system according to an embodiment.

FIG. 9 is a block diagram showing a phase detection system according to an embodiment.

The phase detection system 10a of FIG. 9 is different from the phase detection system 10 of FIG. 1 in that a controller 100a provides operation mode information mSet including information about a low state retention time of a second control signal CON2 to a memory device 200a. The memory device 200a provides the controller 100a a guaranteed phase detection result g_PD obtained through phase detection by filtering the second control signal CON2.

Other contents not described herein are the same as those of FIG. 1, and thus a detailed description thereof is omitted.

The controller 100a can check a low state retention time of a second control signal CON2 based on a signal provided by an external device, such as a host (refer to FIG. 15) and enters a phase detection mode. Furthermore, information about the low state retention time may be supplied to the operation units 210a of the memory device 200a as the operation mode information mSet.

The controller 100a generates a different second control signal CON2 based on a low state retention time of a second control signal CON2. More particularly, when the low state retention time of the second control signal CON2 is a predetermined time or more, the controller 100a may generate a second control signal CON2 having two or more neighboring pulses and provide the generated second control signal CON2 to the memory device 200a. When the low state retention time is less than the predetermined time, the controller 100a may generate a second control signal CON2 including one or more pulses having a period of the low state retention time and provide the generated second control signal CON2 to the memory device 200a.

The memory device 200a may filter the second control signal CON2 based on the operation mode information mSet received from the controller 100a.

When the low state retention time is the predetermined time or more, the memory device 200a removes the first pulses of the two or more neighboring pulses of the second control signal CON2. Accordingly, a filtered second control signal f_CON2 has only the second pulses, and the memory device 200a detects a phase of the first control signal CON1 in response to the filtered second control signal f_CON2.

If the low state retention time is less than the predetermined time, the memory device 200a removes the first pulses from the one or more pulses that are provided at the period of the low state retention time. Accordingly, a filtered second control signal f_CON2 may include all subsequent signals except the first pulses, and the memory device 200a detects a phase of the first control signal CON1 in response to the filtered second control signal f_CON2.

A phase detection result based on the filtered second control signal f_CON2 is supplied to the controller 100a as a guaranteed phase detection result g_PD. Phase detection values that have already been determined to be accurate are supplied to the controller 100a, and thus the controller 100a does not need to additionally determine accuracy of phase detection.

Figure 10:
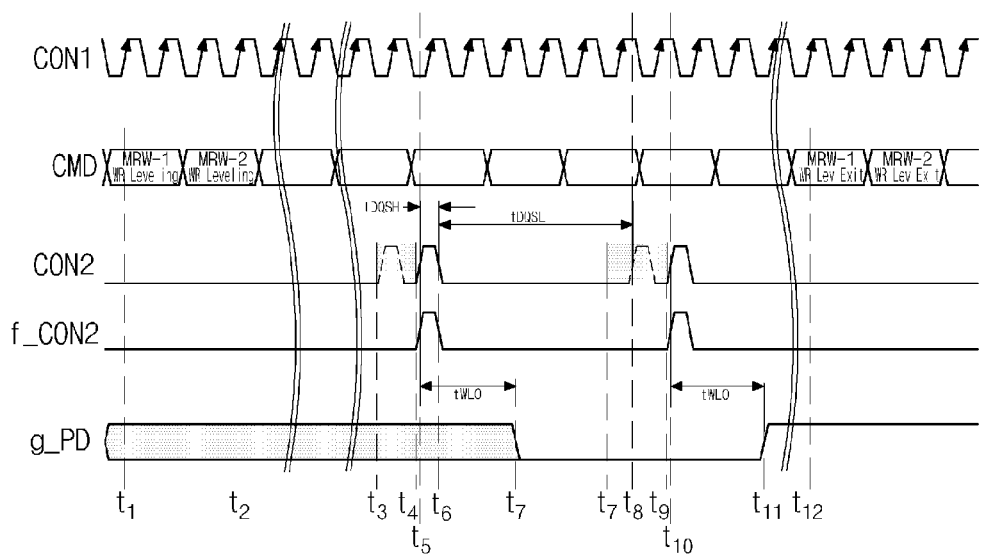
FIGS. 10 and 11 are timing diagrams illustrating phase detection methods performed by the phase detection system of FIG. 9.
Figure 11:
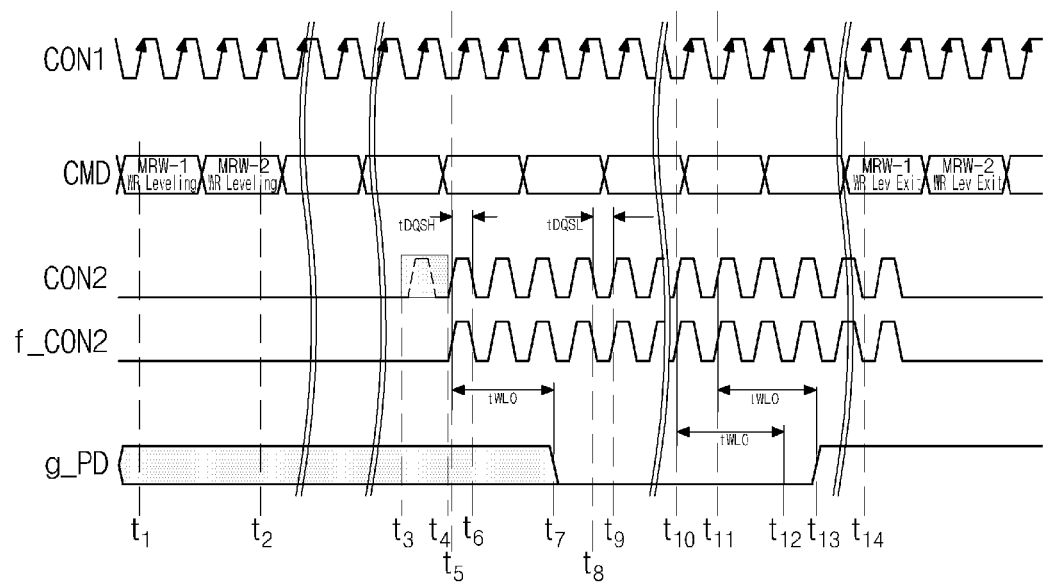

FIGS. 10 and 11 are timing diagrams illustrating phase detection methods performed by the phase detection system 10a of FIG. 9. FIGS. 10 and 11 also contain some of the same features as illustrated in FIGS. 3 and 4, and repeated descriptions in part will be omitted. FIG. 10 is a timing diagram when a low state retention time tDQSL of a second control signal CON2 is set to a maximum value, and FIG. 11 is a timing diagram when the low state retention time tDQSL of the second control signal CON2 is set to a minimum value. The low state retention time tDQSL may be set by an external device, such as a host.

A first control signal CON1 may be a signal that oscillates in a constant period. In various embodiments, the first control signal CON1, together with its complementary signal, may be differentially provided. Accuracy in the phase detection of the first control signal CON1 can be improved by performing a differential operation. For example, the memory device 200a can perform phase detection on each of the differential signals of the first control signal CON1 and the differential signals of the second control signal CON2.

At a first time t1, the controller 100a generates a command signal CMD and provides the command signal CMD to the memory device 200a. The command signal CMD is provided until a second time t2. At the second time t2, the memory device 200a enters a phase detection mode.

In various embodiments, an external input signal may include information about the low state retention time tDQSL. The controller 100a can check the low state retention time tDQSL and provide the checked low state retention time tDQSL to the memory device 200a as the operation mode information mSet.

FIG. 10 is a timing diagram when the low state retention time tDQSL is set to a maximum value. The memory device 100a can determine a method of generating the second control signal CON2 by checking the low state retention time tDQSL. In FIG. 10, the low state retention time of the second control signal CON2 is from a sixth time t6 to an eighth time t8.

After entering the phase detection mode, the controller 100a determines that the low state retention time of the second control signal CON2 is a predetermined time or more, generates a second control signal CON2 having two or more neighboring pulses, and provides the generated second control signal CON2 to the memory device 200a.

Accordingly, the second control signal CON2 having the two neighboring pulses is supplied to the memory device 200a. In various embodiments, a period between the first rising edge and the second rising edge of the second control signal CON2 may be the same as or within the period of the first control signal CON1.

If a phase is detected in response to the first pulse of the two neighboring pulses of the second control signal CON2, however, accuracy of the phase detection result cannot be guaranteed. Accordingly, the memory device 200a removes the first pulse of the second control signal CON2 by masking the second control signal CON2 from a third time t3 to a fourth time t4, that is, before and after the first pulse of the second control signal CON2 is entered, and generates a filtered second control signal f_CON2. The memory device 200a transmits the second pulse from a fifth time t5 to a sixth time t6 without change.

The memory device 200a detects a phase of the first control signal CON1 at the fifth time t5 in response to the filtered second control signal f_CON2 and provides the detected phase to the controller 100a as an guaranteed phase detection result g_PD at a seventh time t7.

After the point of time t6, the controller 100a provides the memory device 200a with a second control signal CON2 having two pulses that neighbor each other at the eighth time t8 and a tenth t10 after the low state retention time of the second control signal CON2.

The memory device 200a generates a second control signal CON2 that has been filtered by removal, such as by masking the second control signal CON2 from the seventh time t7 to a ninth time t9 in order to remove the first pulse of the two neighboring pulses of the second control signal CON2.

The memory device 200a detects a phase of the first control signal CON1 based on the filtered second control signal CON2. Thus, a guaranteed phase detection result g_PD at an eleventh time t11 is supplied to the memory device 100a in response to the second pulse of the second control signal CON2 at the tenth time t10.

The guaranteed phase detection result g_PD at the seventh time t7 and the guaranteed phase detection result g_PD at the eleventh time t11 have different logic states. In such a case, it is determined that the phase detection results have been centered and thus the phase detection mode is terminated at a twelfth time t12.

The phase detection method of FIG. 10 is the same as the phase detection method of FIG. 3 in that the controller 100a generates and provides a second control signal CON2. In the phase detection method of FIG. 3, the controller 100 determines accuracy of phase detection results PD received from the memory device 200 and performs filtering. In contrast, in the phase detection method of FIG. 10, the memory device 200a generates a filtered second control signal CON2 so that only pulses whose accuracy can be guaranteed are taken from a second control signal CON2 received from the controller 100a, generates a guaranteed phase detection result g_PD by detecting a phase of a first control signal CON1 based on the filtered second control signal CON2, and provides the generated guaranteed phase detection result g_PD to the controller 100a.

FIG. 11 is a timing diagram illustrating a phase detection method when the low state retention time of the second control signal CON2 is less than a predetermined time.

The phase detection method of FIG. 11 is the same as the phase detection method of FIG. 4 in that the controller 100a generates a second control signal CON2 including one or more pulses having a period of the low state retention time of the second control signal CON2 based on the low state retention time of the second control signal CON2 and provides the second control signal CON2 to the memory device 200a.

Referring to FIG. 11, the controller 100a applies a command signal CMD to the memory device 200a at a first time t1 so that the memory device 200a enters a phase detection mode at a second time t2. The memory device 200a receives operation mode signal mSet from the controller 100a. It can be seen that a plurality of pulses having a low state retention time tDQSL from an eighth time t8 to a ninth time t9 are provided from the controller 100a to the memory device 200a.

If the low state retention time tDQSL is less than a predetermined time, accuracy of a phase detection result PD based on a pulse of the second control signal CON2 right after the low state retention time has elapsed can be guaranteed.

As described above with reference to FIG. 4, however, accuracy in the phase detection of a pulse that is first provided after entering the phase detection mode cannot be guaranteed. Accordingly, the memory device 200a generates a filtered second control signal f_CON2 by removing the first pulse of the second control signal CON2 after entering the phase detection mode, such as by masking the second control signal CON2 from a third time t3 to a fourth time t4.

When the first pulse of the second control signal CON2 is removed, all pulses generated subsequently can be used to detect a phase. Each of the pulses can have a high state retention time tDQSH from a fifth time t5 to a sixth time t6.

A guaranteed phase detection result g_PD having a logic state 'Low' is supplied to the controller 100a at a seventh time t7 in response to a filtered second control signal f_CON2 at the fifth time t5.

An guaranteed phase detection result g_PD is provided at a twelfth time t12 in response to a filtered second control signal f_CON2 at a tenth time t10, but the guaranteed phase detection result g_PD has a logic state 'Low' like at the seventh time t7 and has not yet been centered.

Accordingly, at an eleventh time t11, a next pulse of the second control signal CON2 is provided. A result of the detection of a phase of the first control signal CON1 based on the next pulse of the second control signal CON2 is provided as a guaranteed phase detection result g_PD at a thirteenth time t13. The guaranteed phase detection result g_PD has a logic state 'High' at the thirteenth time t13 and thus has a different logic state from the first guaranteed phase detection result g_PD. Accordingly, it is determined that the phase detection results have been centered. Thereafter, the phase detection mode is terminated at a fourteenth time t14.

Figure 12:
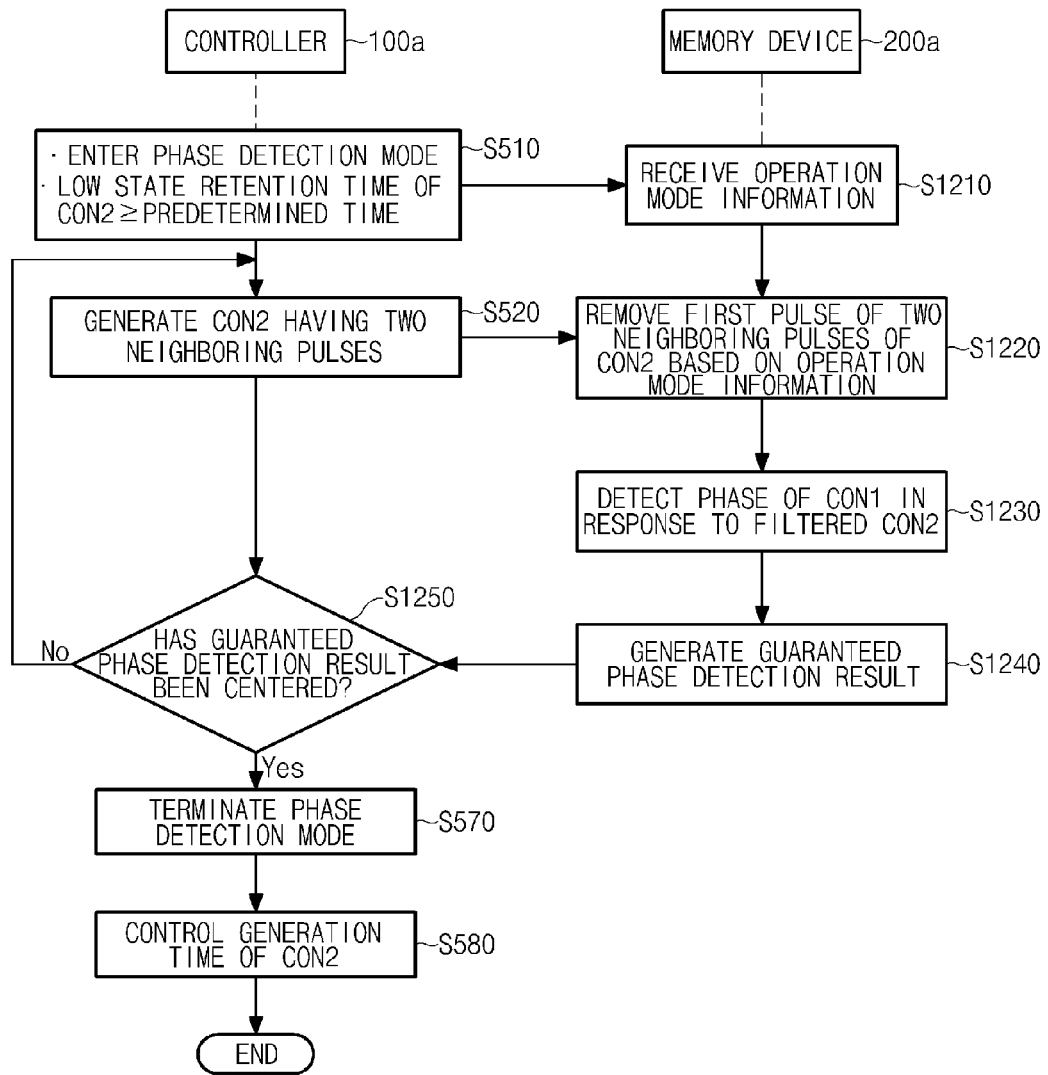
FIGS. 12 and 13 are flowcharts illustrating the phase detection methods described with reference to FIGS. 10 and 11.
Figure 13:
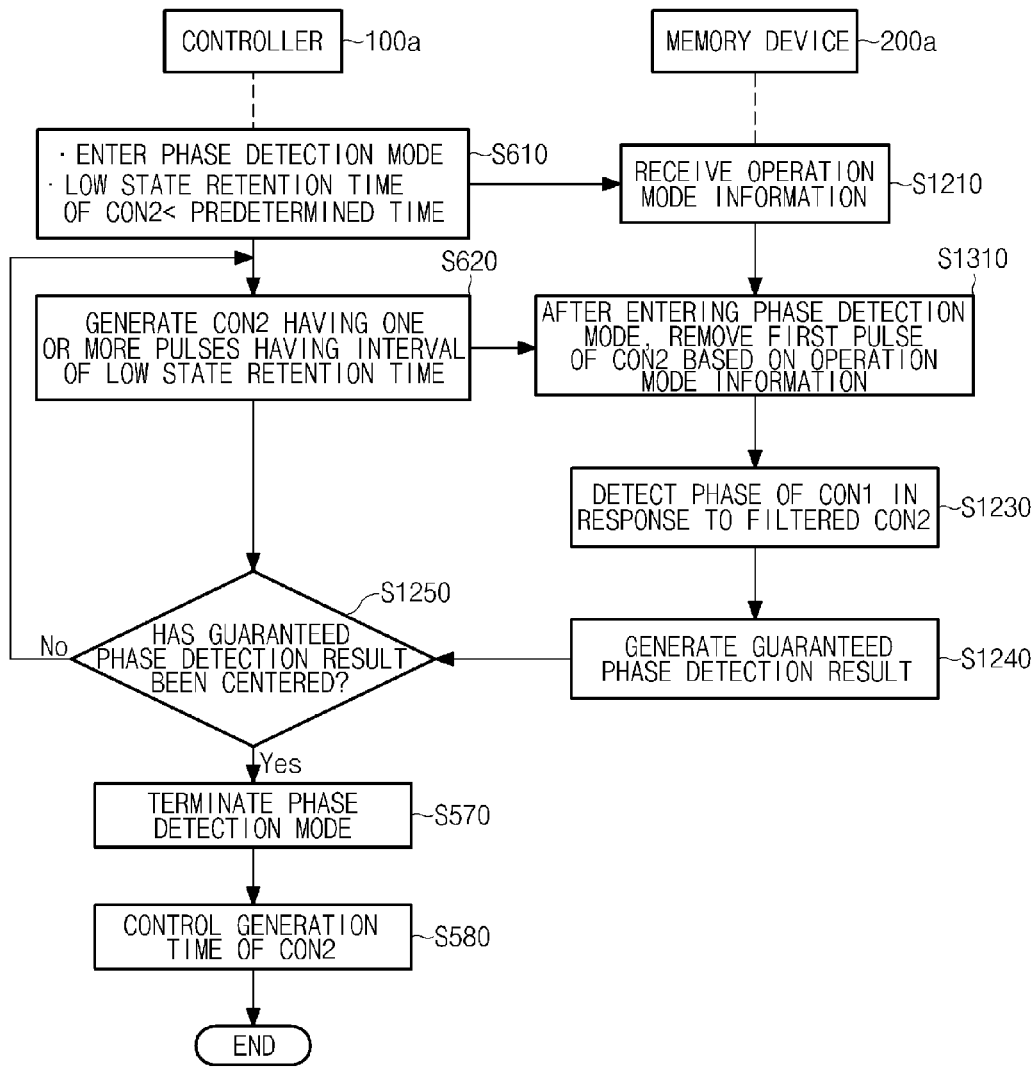

FIGS. 12 and 13 are flowcharts illustrating the phase detection methods described with reference to FIGS. 10 and 11.

FIG. 12 shows a method of removing, by the memory device 200a, a first pulse from two neighboring pulses provided by the controller 100a and performing phase detection when a low state retention time of a second control signal CON2 is a predetermined time or more as described above with reference to FIG. 10.

Some steps of the flowchart shown in FIG. 12 are similar to those of the phase detection method described with reference to FIG. 5, and thus a detailed description thereof is omitted. Steps having the same reference numerals have the same characteristics.

Referring to FIG. 12, the memory device 200a receives operation mode information mSet from the controller 100a at step S1210. The operation mode information mSet includes information about a low state retention time of a second control signal CON2. The memory device 200a may expect that a second control signal CON2 having two or more neighboring pulses will be supplied by the controller 100a after a lapse of a predetermined time since it enters a phase detection mode based on the operation mode information mSet.

The memory device 200a generates a filtered second control signal f_CON2 by removing a first pulse from the two or more neighboring pulses of the second control signal CON2 based on the operation mode information mSet at step S1220.

The memory device 200a detects a phase of a first control signal CON1 in response to the filtered second control signal f_CON2 at step S1230. The detected phase is supplied to the controller 100a as an guaranteed phase detection result g_PD at step S1240.

The guaranteed phase detection result g_PD obtained in response to the filtered second control signal CON2 whose accuracy of phase detection is guaranteed has been received from the memory device 200a. Thus, the controller 100a does not need to additionally determine accuracy of phase detection.

When the guaranteed phase detection result g_PD has not been centered, that is, when an guaranteed phase detection result g_PD having a different logic state from the first guaranteed phase detection result g_PD has not been received (No, S1250), steps S520, S1220, S1230, and S1240 are repeated.

After the guaranteed phase detection result g_PD is centered (Yes, S1250), the phase detection mode is terminated at step S570.

The controller 100a can control a point of time at which a second control signal CON2 is generated based on the guaranteed phase detection result g_PD at step S580.

FIG. 13 shows a method of removing, by the memory device 200a, a first pulse after entering a phase detection mode, from one or more pulses of a second control signal CON2 provided by the controller 100a and performing phase detection when a low state retention time of the second control signal CON2 is less than a predetermined time as described above with reference to FIG. 11.

Some steps of the flowchart shown in FIG. 13 are similar to those of the phase detection methods described with reference to FIGS. 5, 6, and 12, and thus a detailed description thereof is omitted. Steps having the same reference numerals have the same characteristics.

The memory device 200a receives operation mode information mSet from the controller 100a at step S1210 and may expect that a second control signal CON2 having one or more pulses having a period of a low state retention time will be supplied by the controller 100a.

The memory device 200a removes the first pulse of a second control signal CON2, provided after entering a phase detection mode, based on operation mode information mSet and provides a filtered second control signal f_CON2 at step S1310. It is assumed that accurate phase detection will be performed from the second pulse of the second control signal CON2 after the phase detection mode.

The memory device 200a detects a phase of a first control signal CON1 in response to the filtered second control signal f_CON2 at step S1230. The detected phase is supplied to the controller 100a as an guaranteed phase detection result g_PD at step S1240.

The guaranteed phase detection result g_PD obtained in response to the filtered second control signal CON2 whose accuracy of phase detection is guaranteed has been received from the memory device 200a. Thus, the controller 100a does not need to additionally determine accuracy of phase detection.

If the guaranteed phase detection result g_PD has not been centered, that is, when an guaranteed phase detection result g_PD having a different logic state from the first guaranteed phase detection result g_PD has not been received (No, S1250), steps S620, S1230, and S1240 are repeatedly performed.

If the guaranteed phase detection result g_PD has been centered (Yes, S1250), the phase detection mode is terminated at step S570.

The controller 100a can control a point of time at which a second control signal CON2 is generated based on the guaranteed phase detection result g_PD at step S580.

In the case of the phase detection method and system described with reference to FIGS. 9 to 13, the memory device 200a filters a second control signal CON2 based on operation mode information mSet on which a low state retention time of the second control signal CON2 can be aware. A phase of the filtered second control signal CON2 can be detected certainly. Accordingly, accuracy of a guaranteed phase detection result g_PD can be improved, and the controller 100a may consider all received guaranteed phase detection results g_PD to be valid without determining accuracy of the guaranteed phase detection results g_PD.

Figure 14:
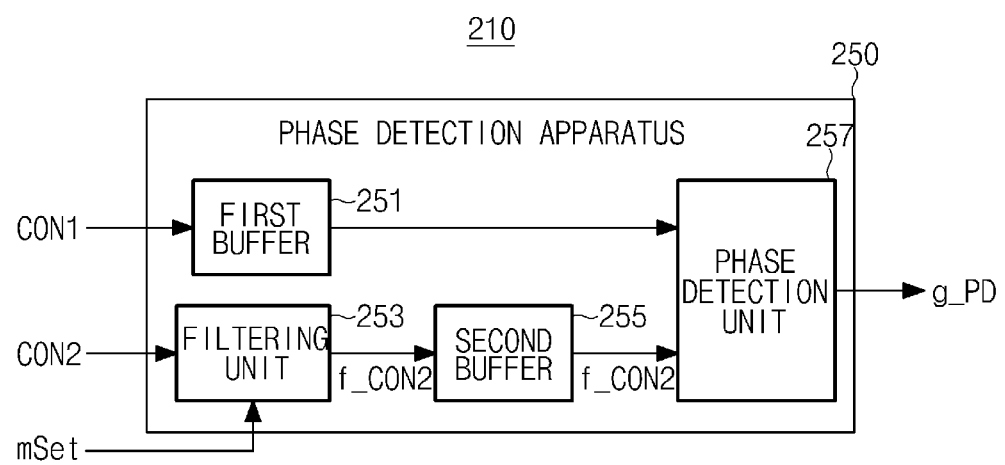
FIG. 14 is a diagram showing a phase detection apparatus included in a memory device according to an embodiment.

The operation unit 210 of the memory device 200 according to various embodiments may include a phase detection apparatus 250, such as that shown in FIG. 14.

The phase detection apparatus 250 may include a first buffer 251 for receiving a first control signal CON1, a filtering unit 253 for receiving a second control signal CON2 based on operation mode information mSet, and a phase detection unit 257.

The first buffer 251 can receive the first control signal CON1 from the controller 100a and provide the first control signal CON1 to the phase detection unit 257.

The filtering unit 253 can remove a specific pulse of the second control signal CON2, received from the controller 100a, based on the operation mode signal mSet and provide a filtered second control signal f_CON2.

As described above, when a low state retention time of the second control signal CON2 is a predetermined time or more, the filtering unit 253 removes a first pulse from the two or more neighboring pulses of the second control signal CON2. When the low state retention time of the second control signal CON2 is less than the predetermined time, the filtering unit 253 removes the first pulse from the one or more pulses of the second control signal CON2.

The phase detection unit 257 can detect a phase of the first control signal CON1 in response to the filtered second control signal CON2, generate a guaranteed phase detection result g_PD, and provide the guaranteed phase detection result g_PD to the memory device 100a.

In various embodiments, the phase detection apparatus 250 may further include a second buffer 255 for receiving the filtered second control signal f_CON2 and providing the filtered second control signal f_CON2 to the phase detection unit 257.

Figure 15:
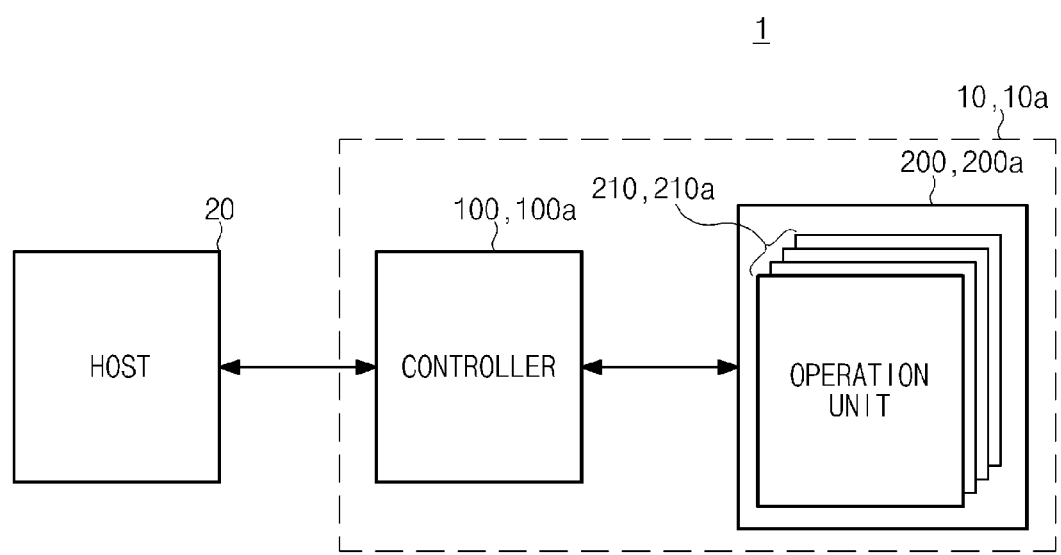
FIG. 15 is a block diagram showing an electronic device including a phase detection system and a host according to embodiments.

FIG. 15 is a block diagram showing an electronic device 1 including the phase detection system 10 or 10a and a host according to embodiments.

Referring to FIG. 15, the electronic device 1 may include the host 20 and the phase detection system 10 or 10a.

The phase detection system 10 may have the same construction and operation characteristics as those described with reference to FIGS. 1 to 8 and the phase detection system 10a may have the same construction and operation characteristics as those described with reference to FIGS. 9 to 14, and thus a detailed description thereof is omitted.

The electronic device 1 can receive a signal related to an operation mode from the host 20, and the controller 100 or 100a can generate a command signal CMD and provide the command signal CMD to the memory device 200 or 200a. The operation unit 210 or 210a included in the memory device 200 or 200a can operate based on the command signal CMD.

In various embodiments, the operation unit 210 or 210a can perform operations for writing and reading data in addition to a phase detection operation. The operations for writing and reading data may be performed when memory for storing data is additionally included in each operation unit 210 or 210a. The memory may include at least one of volatile memory and non-volatile memory.

The writing and reading of data may be performed in response to a command from the host 20, or the controller 110 or 100a can control the operations of the memory device 200 or 200a.

In embodiments, for accurate phase detection between the first control signal CON1 and the second control signal CON2, the phase detection system 10 may determine accuracy of a phase detection result PD obtained in response to a pulse of the second control signal CON2, determine a phase detection result PD based on a specific pulse to be uncertain, and do not use the uncertain phase detection result PD in phase correction.

Furthermore, the phase detection system 10 or 10a can generate a guaranteed phase detection result g_PD by removing a specific pulse of the second control signal CON2 and performing phase detection, thereby being capable of increasing accuracy of phase detection.

Accordingly, a phase detection characteristic can be improved and a phase error in the overall operation of the electronic device 1 can be reduced.

When an error in the phase of the electronic device 1 is reduced, reliability of an overall operation may be improved. In particular, when operation speed of the electronic device 1 is increased, an effect resulting from improved accuracy of phase detection can be doubled.

In various embodiments, the memory device 200 or 200*a* may include a plurality of the operation units 210 or 210*a*. The plurality of operation units 210 or 210*a* may be implemented in such a way as to be stacked over the controller 110 or 100*a*.

Figure 16:
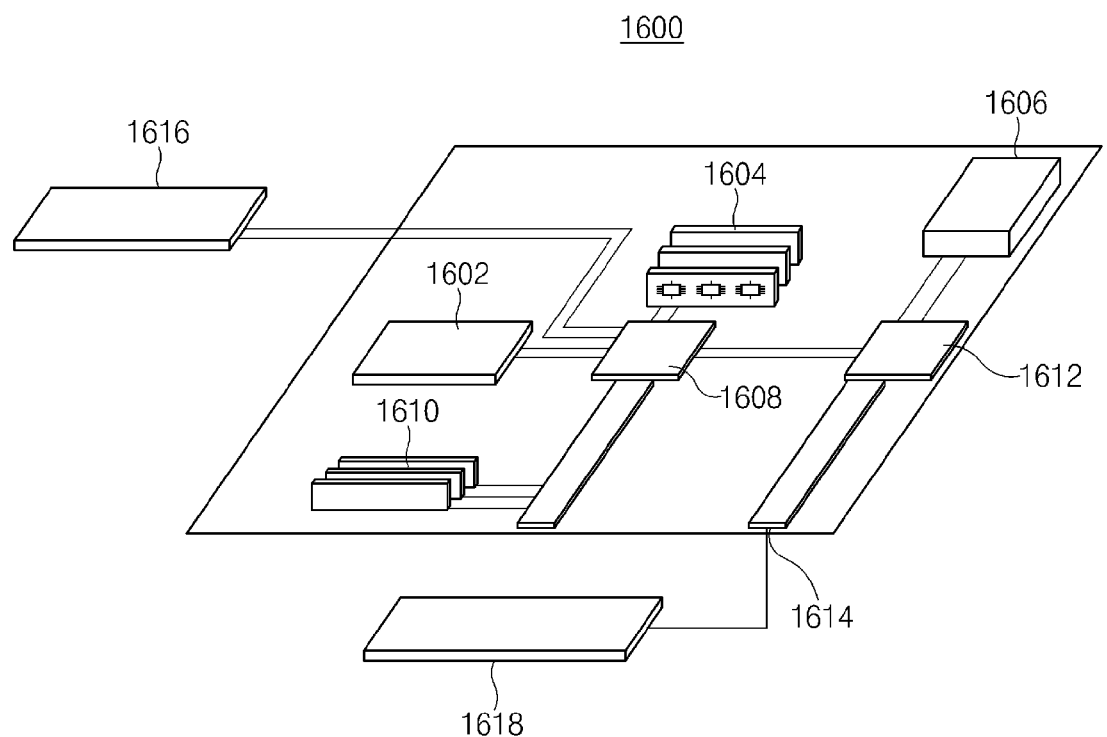
FIG. 16 is a diagram showing a computing device including a phase detection system according to embodiments.

FIG. 16 is a diagram showing a computing device including the phase detection system according to embodiments.

The phase detection system 10 or 10*a* according to an embodiment may be included in the computing device 1600. The computing device may include various types of digital computers, such as a laptop, a desktop, a workstation, a PDA, a server, a blade server, or a main frame.

The computing device may include a processor 1602, a memory device 1604, a storage device 1606, a high-speed interface 1608 and high-speed extension ports 1610 coupled to the memory device 1604, and a low-speed interface 1612 coupled to a low-speed extension port 1614 and the storage device 1606.

The processor 1602, the memory device 1604, the storage device 1606, the high-speed interface 1608, the high-speed extension ports 1610, the low-speed extension port 1614, and the low-speed interface 1612 may be interconnected using various types of buses.

The processor 1602 can process instructions executed in the computing device 1600. The instructions processed by the processor 1602 may include an instruction for displaying graphic information on an external input/output device coupled to the high-speed interface 1608 or instructions that are stored in the memory device 1604 or the storage device 1606 for high-speed data input/output. In an embodiment, a multi-processor or a multi-bus or both may be used along with a multi-memory and memory type.

The processor 1602 may correspond to the controller 100 or 100*a* shown in FIGS. 1 and 9. In an embodiment, the processor 1602 can provide the memory device 1604 or the storage device 1606 or both with the second control signal CON2 having two neighboring pulses according to a low state retention time of the second control signal CON2 or having pulses having a period of the low state retention time, which is provided through the controller 100 or 100*a* in accordance with an instruction.

Furthermore, the memory device 1604 or the storage device 1606 or both can detect a phase in response to the second control signal CON2. In various embodiments, the memory device 1604 or the storage device 1606 or both may receive information about the low state retention time of the second control signal CON2 from the processor 1602, remove a specific pulse of the second control signal CON2, and perform phase detection.

Furthermore, the processor 1602 can determine accuracy of phase detection results received from the memory device 1604 or the storage device 1606 or both, selectively adopt a phase detection result, and control a point of time at which a second control signal CON2 is generated based on the adopted phase detection result.

The memory device 1604 can store various types of information in the computing device 1600. In an embodiment, the memory device 1604 may be a volatile memory unit or a non-volatile memory unit. The volatile memory unit or the non-volatile memory unit may include various circuits for memory writing and reading in addition to volatile memory or non-volatile memory. In various embodiments, the memory device 1604 may be a computer-readable medium capable of storing data, such as a magnetic medium or an optical disk.

As shown in FIG. 16, the memory device 1604 may be made up of a plurality of memory chips. The operations of the memory chips are controlled by the processor 1602. In an embodiment of the present disclosure, in order to correct phases of the plurality of chips of the memory device 1604, the phase detection apparatus 250 can be included in each of the memory chips of the memory device 1604. A phase detection method may be controlled by the processor 1602 or may be performed by the memory device 1604.

The storage device 1606 can provide mass storage for the computing device 1600. In an embodiment, the storage device 1606 may be a floppy disk device, a hard disk device, an optical disk device, a tape device, flash memory or a similar solid state memory device, or a device array including a device that is present in a storage area network or other elements.

A computer program product may have been materialized in various types of means capable of storing information in a pattern form. When the computer program product is executed, the computer program product may include the aforementioned instructions and instructions for executing the phase detection method. The various types of means capable of storing information may be a computer- or machine-readable medium, such as the memory device 1604, the storage device 1606, or memory on the processor 1602.

The low-speed interface 1612 and the high-speed interface 1608 can perform interfacing between elements having different operation speeds within the computing device 1600. However, the arrangement of the illustrated elements is only illustrative.

In an embodiment, the high-speed interface 1608 may be coupled to the memory device 1604 and an input/output device 1616 and may be coupled to the high-speed extension ports 1610 in which various types of extension cards can be received. In various embodiments, the low-speed interface 1612 is coupled to the storage device 1606 and the low-speed extension port 1614. The low-speed extension port 1614 capable of including various communication ports (e.g., USB, Bluetooth, Ethernet, and wireless Ethernet) may be coupled to one or more input/output devices 1618, such as a keyboard, a mouse, a pointing device, and a scanner, or may be coupled to a networking device through a network adaptor.

The computing device 1600 may be implemented using a standard server, a plurality of the computing devices may be included in a server group, or the computing device 1600 may be implemented as part of a rack server system. Furthermore, the computing device 1600 may be implemented in a personal computer, such as a laptop computer.

The phase detection system and the phase detection method described in this specification may be realized using a digital electronic circuit, an integrated circuit, application specific integrated circuits (ASICs) designed for special purposes, computer hardware, firmware, software, and/or a combination of them.

Such an implementation of the computing system may be performed by one or more computer programs. The computer program (or a program, software, a software application, or code) may include machine instructions for a programmable processor and may be implemented using a high-level procedure and/or an object-oriented programming language and/or assembly/machine languages.

The computer program can be executed on a programmable system. The programmable system may include at least one dedicated or general-purpose programmable processor, at least one dedicated or general-purpose input device, and at least one dedicated or general-purpose output device which are coupled to a storage system and configured to send and receive data and instructions.

The various phase detection system and phase detection method described in this specification may be implemented using a computing system that includes a backend element, a middleware element, a frontend element (e.g., a client computer including a graphic user interface (GUI) or a web browser capable of being used by a user), or a specific combination of the backend, middleware, and/or frontend elements.

The elements of the system may be interconnected in a specific form or by a digital data communication medium (e.g., a communication network). For example, a communication network may include a local area network (LAN), a wide area network (WAN), and the Internet.

The computing system may include a client and a server. In general, the client and the server are spaced apart from each other, and they interact with each other over a communication network. A relation between the client and the server is generated by computer programs that are being executed by each computer and configured to have a client-server relation.

The aforementioned phase detection method and system according to an embodiment can provide a control signal having two consecutive pulses after a phase detection mode is entered and detect a phase in response to a pulse subsequent to the first pulse of the two consecutive pulses of the control signal in order to improve a poor signal characteristic of a pulse that is retained in a low state for a specific time and then supplied.

The phase detection method and system according to an embodiment can improve accuracy of phase detection, minimize an error that may occur due to a dislocated phase, and improve operational reliability.

The phase detection system according to the embodiments can be usefully used in a small-sized electronic device for performing a high-speed operation because it can improve accuracy of phase detection through a simple construction.

The phase detection method and system according to the embodiments can increase accuracy of phase detection because it determines a phase detection result, obtained in response to a control signal having a poor signal characteristic, to be uncertain.

The phase detection method and system according to the embodiments can selectively use a phase detection result based on a specific state retention time of a control signal in order to determine that the control signal has a pulse having an excellent signal characteristic.

The phase detection method and system according to the embodiments can increase accuracy of a phase detection result using a different method of providing a control signal based on a specific state retention time of a control signal.

While certain embodiments have been described above, it will be understood to those skilled in the art that the embodiments described are by way of example only. Accordingly, the method and system described herein should not be limited based on the described embodiments. Rather, the apparatus described herein should only be limited in light of the claims that follow when taken in conjunction with the above description and accompanying drawings.

What is claimed is:

1. A phase detection method, comprising:
providing by a controller a second control signal having two or more neighboring pulses when a time during which a state of a second control signal is retained is a predetermined time or more;
receiving by the controller phase detection results of a phase of a first control signal different from the second control signal in response to the second control signal; and
determining by the controller a phase detection result based on a first pulse of the two or more neighboring pulses of the second control signal of the phase detection results.

2. The phase detection method of claim 1, wherein the two or more neighboring pulses of the second control signal are generated at an interval within a period of the first control signal.

3. The phase detection method of claim 1, wherein the state of the second control signal corresponds to a logic low state.

4. The phase detection method of claim 1, wherein determining a-phase-detection-result comprises:
determining a phase detection result, obtained in response to a second pulse of the two or more neighboring pulses of the second control signal, to be accurate.

5. The phase detection method of claim 1, further comprising: controlling generation times of the pulses of the second control
signal based on a determination of an accuracy of the phase detection result.

6. The phase detection method of claim 1, further comprising:
providing the second control signal having one or more pulses having a period of the time during which the state of the second control signal is retained during which the state of the second control signal is retained is less than the predetermined time.

7. The phase detection method of claim 6, wherein determining a-phase-detection-result comprises:
determining only the phase detection result, obtained in response to the first pulse of the second control signal, to be uncertain.

8. The phase detection method of claim 1, further comprising:
filtering the uncertain phase detection result.

9. The phase detection method of claim 1, wherein:
the first control signal corresponds to a clock signal, and
the second control signal corresponds to a data strobe signal.

10. The phase detection method of claim 1, wherein:
the phase detection method is initiated in response to the command signal that includes information about the time during which the state of the second control signal is retained.

11. A phase detection system, comprising:
a controller configured to generate a second control signal having two or more neighboring pulses during which a first state of a second control signal retained is a predetermined time or more and generate the second control signal having one or more pulses during which the first state of the second control signal is retained when the first state of the second control signal retained is less than the predetermined time; and
an operation unit configured to comprise a phase detection unit for generating phase detection results of a phase of a first control signal different from the second control signal in response to the second control signal.

12. The phase detection system of claim 11, wherein the controller determines only the phase detection result, obtained in response to a second pulse of the two or more neighboring pulses, to be accurate when the first state of the second control signal retained is the predetermined time or more and determines phase detection results, obtained in response to all pulses other than a first pulse of the one or more pulses, to be accurate when the first state of the second control signal retained is less than the predetermined time.

13. The phase detection system of claim 12, wherein the controller comprises:
a filtering unit for generating a guaranteed phase detection result by filtering only the phase detection results determined to be accurate, based on information about the time during which the first state of the second control signal is maintained.

14. The phase detection system of claim 13, wherein the controller further comprises:
a signal generation unit for controlling a point of time at which the second control signal is generated based on the guaranteed phase detection result.

15. The phase detection system of claim 11, wherein:
the first state of the second control signal corresponds to a logic low state, and
a second state of the second control signal corresponds to a time during which a pulse of the second control signal is maintained.

16. The phase detection system of claim 11, wherein the phase detection is terminated when a period of the phase detection result elapses.

17. A phase detection system, comprising:
a controller configured to generate a second control signal having two or more neighboring pulses when a first state of a second control signal retained is a predetermined time or more and generate a second control signal having one or more pulses which the first state of the second control signal is retained when the first state of the second control signal retained is less than the predetermined time; and
an operation unit configured to comprise a phase detection unit for receiving the second control signal, removing a first pulse of the two or more neighboring pulses when the first state of the second control signal retained is the predetermined time or more, removing a first pulse of the one or more pulses when the first state of the second control signal retained is less than the predetermined time, and generating phase detection results by detecting a phase of a first control signal different from the second control signal in response to the filtered second control signal.

18. The phase detection system of claim 17, wherein the phase detection unit comprises:
a filtering unit for receiving information about the time during which the first state of the second control signal is retained from the controller and filtering the second control signal.

19. The phase detection system of claim 17, wherein:
a plurality of the operation units is included in a memory device, and
a memory device sends and receives signals to and from the controller.

20. The phase detection system of claim 19, wherein:
the second control signal is supplied to the plurality of operation units, and
the first control signal is supplied to the memory device through a signal coupling line and sequentially supplied to the plurality of operation units.

* * * * *